United States Patent [19]

Catlin

[11] Patent Number: 4,814,983

[45] Date of Patent: * Mar. 21, 1989

[54] DIGITAL COMPUTER FOR IMPLEMENTING EVENT DRIVEN SIMULATION ALGORITHM

[75] Inventor: Gary M. Catlin, Campbell, Calif.

[73] Assignee: Daisy Systems Corporation, Mountain View, Calif.

[*] Notice: The portion of the term of this patent subsequent to Jun. 14, 2005 has been disclaimed.

[21] Appl. No.: 118,295

[22] Filed: Nov. 6, 1987

Related U.S. Application Data

[63] Continuation of Ser. No. 594,533, Mar. 28, 1984.

[51] Int. Cl.[4] ............................................. G06F 15/16
[52] U.S. Cl. .............................. 364/200; 364/230.4; 364/228.3; 364/231.8; 364/229.3; 364/232.3
[58] Field of Search ... 364/200 MS File, 900 MS File

[56] References Cited

U.S. PATENT DOCUMENTS

| | | | |
|---|---|---|---|
| 3,701,976 | 10/1972 | Shively | 364/200 |
| 4,123,794 | 10/1978 | Matsumoto | 364/200 X |
| 4,334,305 | 6/1982 | Girardi | 364/200 X |
| 4,335,426 | 6/1982 | Maxwell et al. | 364/200 |
| 4,351,025 | 9/1982 | Hall, Jr. | 364/200 |
| 4,365,297 | 12/1982 | Grisham, Jr. | 364/200 |
| 4,396,978 | 8/1983 | Hammer et al. | 364/200 |
| 4,466,063 | 8/1984 | Segarra et al. | 364/200 |
| 4,468,734 | 8/1984 | Lanier et al. | 364/200 |
| 4,527,249 | 7/1985 | Van Brunt | 364/578 |

FOREIGN PATENT DOCUMENTS

| | | |
|---|---|---|
| 0021404 | 7/1981 | European Pat. Off. . |
| 2096369 | 10/1982 | United Kingdom . |
| 81/01066 | 4/1981 | World Int. Prop. O. . |

OTHER PUBLICATIONS

Abramovili et al., "A Logic Simulation Machine", IEEE Trans. on Computer-Aided Design of Integrated Circuits and Systems, vol. CAD-2, No. 2, Apr. 1983, pp. 82-94.

"ZYCAD Logic Evaluator", Nov. 1982.

Howard et al., "Parallel Processing Interactively Simulates Complex VSLI Logic", Electronics, Dec. 1983, pp. 147-150.

*Primary Examiner*—Thomas M. Heckler
*Attorney, Agent, or Firm*—Blakely, Sokoloff, Taylor & Zafman

[57] ABSTRACT

A computer for implementing an event driven algorithm which is used in conjunction with a master computer is disclosed. The computer includes a plurality of processors coupled in a ring arrangement each of which is microprogrammable. Each processor includes a memory and a memory address generator. The generator can generate addresses based on a combination of signals from both the microcode and signals on the data bus.

11 Claims, 11 Drawing Sheets

DIGITAL COMPUTER FOR IMPLEMENTING EVENT DRIVEN SIMULATION ALGORITHM

This is a continuation of application Ser. No. 594,533, filed Mar. 28, 1984.

BACKGROUND OF THE INVENTION

1. Field of the Invention.

The invention relates to the field of computer-aided design and more particular to the implementation of simulation algorithms.

2. Prior Art.

In the last ten years, computer-aided design has become commonly used in many fields, such as in the design of electrical circuits. Indeed, today it would be difficult and perhaps economically impossible, to develop a large scale integrated circuit without verification design tools. The "bread boarding" of a circuit having a million components would be a monumental task and equally impractical would be the continual revision to masks required if the circuit were not verified before fabrication.

Numerous work stations or other tools are currently available for simulating systems. The present invention is used in conjunction with one of these commercially available work stations sold under the trademark "Logician" by Daisy Systems Corporation of Sunnyvale, Calif. This prior art system and the algorithm which it implements will be discussed in conjunction with FIGS. 1, 3 and 4. In general, the present invention implements an event driven simulation algorithm in a special purpose computer.

The closest prior art reference known to the Applicant disclosing special purpose computers for implementing simulation algorithms are:

(i) "A Logic Simulation Machine" by Abramovici, M. Et Al, *IEEE Transactions on Computer-Aided Design of Integrated Circuits and Systems* Vol. CAD-2, No. 2, April 1983. The present invention implements an algorithm similar to that described in this article. However, the partitioning used in the present invention is substantially different than that discussed in the article.

(ii) "ZYCAD Logic Evaluator" as described in ZYCAD Corporation's manual dated November, 1982. This apparatus employs different partitioning than the present invention. Moreover, it does not offer the flexibility of the presently described invention where the computer is microcode programmable.

(iii) "Parallel Processing Interactively Simulates Complex VSLI Logic" by Howard, J. Et Al, *Electronics* Dec. 15, 1983, beginning at p. 147. This article describes the implementation of a different algorithm which is not event driven. Different architecture and partitioning are employed. (Applicant does not concede that this particular article is prior art, however, Applicant believes that there are prior art computers employing the teachings of this article.)

SUMMARY OF THE INVENTION

A computer for implementing an event driven algorithm which simulates a system such as an integrated circuit or digital system is described. The computer includes a first, second, and third processor which, in the preferred embodiment, are all substantially identical. A unidirectional bus interconnects each of the processors; specifically, the first processor directs signals to the second processor, the second processor to the third processor and the third processor to the first processor. The first processor includes a first memory for storing the state of the system being simulated at predetermined intervals. In practice, this memory also stores the "fan out" table which would be used in the simulation of a typical circuit. The second processor's memory stores part of the behavior characteristics of each of the components of the system (e.g., truth table for gates). The third processor stores information representing the intervals at which changes in the system will occur and where these changes occur (e.g., the time at which the output of certain gates will change), in addition it stores the delays associated with each gate. Information is pipelined through the three processors and the processors simultaneously operate on the contents of their respective memories in response to signals received from another of the processors.

In the presently preferred embodiment, each processor, on initialization, is programmed with microcode. Thus, the computer has the flexibility of being optimized for different simulations.

Other advantages to the described computer will be apparent from the following description.

DETAILED DESCRIPTION OF THE INVENTION

A computer is described which implements a simulation algorithm. The computer is particularly useful for simulating circuit designs. In the following description, numerous specific details are set forth such as specific number of lines, etc., in order to provide a thorough understanding of the present invention. It will be obvious, however, to one skilled in the art that the present invention may be practiced without these specific details. In other instances, well-known circuits and structures have not been shown in detail in order not to unnecessarily obscure the present invention. Moreover, while the present invention is described in connection with a particular algorithm for circuit simulation, the present invention may be used with other algorithms such as "placement and routing" algorithms.

PRIOR ART SIMULATION ALGORITHM

It will be helpful to an understanding of the present invention to first describe a prior art simulation algorithm. The present invention implements an algorithm similar to this prior art algorithm.

Figure 3:
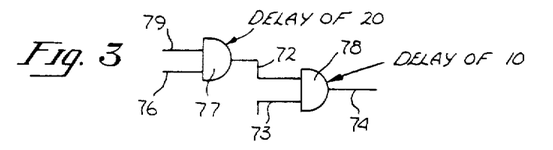
FIG. 3 is a schematic of two gates used to explain a prior art algorithm.

In FIG. 3, two AND gates 77 and 78 are shown. The inputs to AND gates 77 are nodes 76 and 79, and the inputs to AND gates 78 are nodes 72 and 73. The output of the gate 77 is one input to gate 78. The output of gate 78 is line or node 74. For purposes of discussion it is assumed that gate 77 has a delay of 20 units and gate 78 a delay of 10 units.

Figure 4:
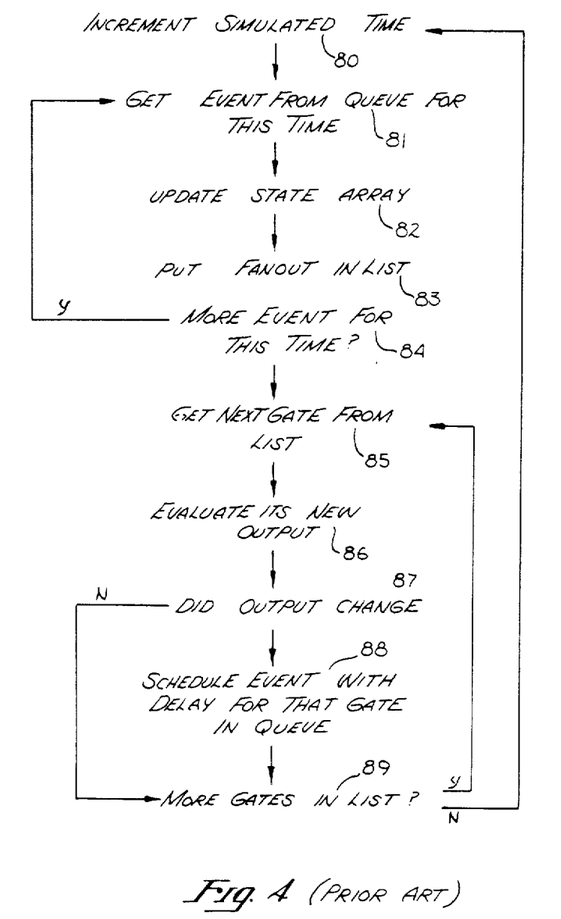
FIG. 4 is a flow diagram used to describe a prior art, event driven, algorithm.

The algorithm set forth in flow diagram form of FIG. 4 can be used to simulate circuits such as the circuit of FIG. 3. Obviously, in practice, much more complicated circuits are simulated containing hundreds of thousands of gates.

In the prior art, before the simulation begins, the circuit which is to be simulated is first represented (digitally) in a predetermined manner. In this representation, a "fanout" of each node is set forth (referred to sometimes as gate entry table). This basically describes all the connections. For instance, referring to FIG. 3, it would be noted that the output of gate 77 (node 72) is connected to one input terminal of gate 78, and if there were other gates connected to this node, they would be set forth. Similarly, for nodes 73, 74, 76 and 79 the other gates coupled to these nodes are set forth. (For the simple example of FIG. 3 no such connections are used.) The circuit representation also includes behavior characteristics of each of the components. For gate 77, the stored characteristics would indicate that the output of the gate goes high when both inputs are high (truth table) and that gate 77 has a delay of 20 units. Similarly, for gate 78 the entry for this gate would indicate that its output goes high when both its inputs are high and that the gate has a delay of 10 units. Also, the state of all the nodes is stored, as will be described, and updated. This is referred to as the "state array".

The simulation proceeds in predetermined intervals typically representing time (e.g., nsec.) which, for present discussion, will be referred to as "units".

Typically, in a simulation, there are initial conditions or inputs to stimulate the system being analyzed. Assume for sake of discussion for the circuit of FIG. 3 that a time 1 the potential on line 79 goes high, at time 10 the potential on node 76 goes high, and at time 40 the potential on node 73 goes high.

Referring to FIG. 4, the first step 80 requires incrementing the time from 0 to 1. At step 81, the events occurring at time 1 are read from memory. For time 1, node 79 goes high (this was previously stored for time 1). Step 82 updates the state array to indicate that node 79 is now high. For step 83, the "fanout" for node 79 is listed. That is, by way of example, if node 79 were connected to inputs of other gates, a notation would be made in memory that the inputs to these gates had changed. Step 84 determines if there are any other events at the current time, time 1. For the example of FIG. 3, there are none and thus, the analysis proceeds to step 85. If there were additional events occurring at time 1, steps 80 through 84 are repeated until all the events occurring at that time are considered.

For step 85, each gate, the input of which has changed, is now examined. This list of gates is developed at step 83 above. (Note that with the described algorithm, only those gates where an input changed are now considered. Thus, the algorithm is referred to as being "event driven".) For the present example, the input to gate 77 changed, thus for step 86 the output of this gate is considered. Since the potential on line 80 is still low, there is no change from the gate, therefore, the flow proceeds to step 89 after step 87. Because there are no more gates in the list at this time, there is return to step 80.

At step 80, time is incremented to time 2. There are no new events "queued" for this time. The time is incremented until there is an event stored for that time. In the present example, this occurs at time 10 when the input on node 76 rises. Thus step 81 consists of determining that at time 10 the potential on line 76 rises. (The events are stored by "time".) At step 82, the state array is updated to indicate that node 76 is now high. (Previously, at time 1 the array was updated to indicate that node 79 is high.) For step 83, the fanout list is prepared, which in this case, consists of only gate 77 since node 76 is only connected to gate 77. For step 84 it is determined that there are no other events stored for time 10 and thus, the next step is step 85. Here, the gates listed in step 83 are selected one at a time. For the current example, gate 77 is selected and in step 86, its output is evaluated from the characteristics (e.g., truth table) previously stored. Since both inputs to the gates 77 are high, its output will be high. At step 87, because the output did change, step 88 is next. Gate 77 has a delay of 20 time units and therefore, its output (node 72) will rise in potential 20 units from the time currently being considered or at time 30. Information is stored in memory for time 30 to indicate a rise in potential on node 72. Since there are no other gates in the list, thre is a return to step 80.

No events are queued between time 10 and time 29. At time 30, for step 81, the potential on node 2 rises. The state array is updated to indicate that node 72 is now high (step 82) and the list of gates connected to this node is made which in the present example is just gate 78. The process moves to steps 85, 86 and 87 and since no change occurs at the output of gate 78, since there are no additional gates in the list, there is a return to state 80.

The next event is scheduled at time 40. At this time, the queue indicates that node 73 rises in potential. The state array is updated and the fanout list is made which, in this case, is simply gate 78 (step 83). At step 86, it is determined that the output of gate 78 does indeed change, and at step 88, an event is stored to indicated that at time 50 (because of the delay of 10 units within gate 78) the output of gate 78 rises in potential. There is now a return to step 80.

For time 50, the state array is updated to indicate that line 74 rises in potential. If a designer was interested in knowing when a change of state occurred on node 74 for the initial conditions set out for the circuit of FIG. 3, the designer would be notified (e.g., through the display or printer).

In practice, the steps shown in FIG. 4 occur quite rapidly. For instance, where an 80286 microprocessor is used, several hundred thousand of the above steps occur each second. Nonetheless, for a very large circuit, a considerable amount of time (e.g., many minutes) is required for simulation.

The computer of the present invention implements an algorithm similar to that shown in FIG. 4 in a specialized computer, enabling the simulation to occur many times faster than with a general purpose microcomputer.

PRIOR ART "LOGICIAN" SIMULATOR

Figure 1:
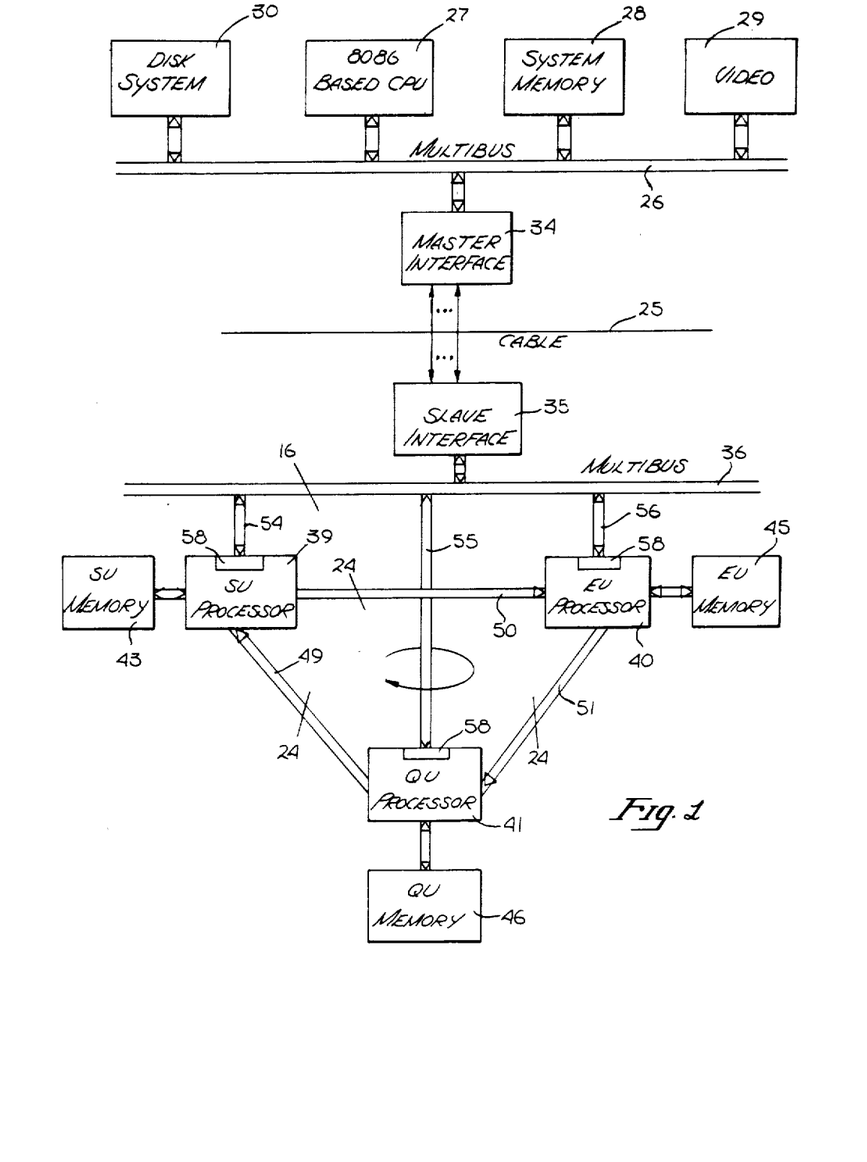
FIG. 1 includes a block diagram showing the overall architecture of the invented computer and a block diagram of a prior art computer used in conjunction with the present invention.

In FIG. 1, a prior art logic simulator which implements the algorithm of FIG. 4 is shown generally above line 25. The simulator operates on a work station which is marketed by Daisy Systems Corporation under the trademark "Logician". In general, this station includes a bus 26 which is a "Multibus". Coupled to this bus are disk system 30, microprocessor board (CPU) 27 (Part No. 8086 or 80286), system memory 28, and video display 29 for user interface. The algorithm of FIG. 4 is implemented in software which is executed by the CPU 27.

With the present invention, an algorithm similar to that shown in FIG. 4 is implemented within the computer shown below line 25. The system above line 25 operates as a master computer performing all the functions normally performed by a simulation machine except for the execution of the algorithm. For execution of the algorithm, the invented computer operates as a slave computer, that is, its operations are in general directed by the master computer.

OVERVIEW OF THE APPARATUS OF THE PRESENT INVENTION

Referring again to FIG. 1, the invented computer comprises three processors, processors 39, 40 and 41. Processors 39, 40 and 41 are interconnected through bidirectional buses 54, 56 and 55, respectively to receive data and addresses from the Multibus 36. Multibus 36 which is a standard 16 bit bus, is interconnected with the Multibus 26 of the master computer through the master interface 34 and slave interface 35. The Multibuses and interfaces 34 and 35 employ standard, well-known circuitry. In the presently preferred embodiment, the Multibuses 35 and 36 are operated synchronously. The bus 36 communicates with each of the processors through a Multibus interface unit 58. The processors, in addition to communicating with Multibus 36, communicate with one another through unidirectional buses which form a ring between the processors. The first processor 39 communicates with the second processor 40 through bus 50, the second processor 40 communicates with the third processor 41 through bus 51, and the third processor 41 communicates with the first processor 39 through bus 49.

The processors 39, 40 and 41 include memories 43, 45 and 46, respectively. Each memory can have a plurality of memory boards, each of which stoes 320K-24 bit words. These memories comprise ordinary dynamic-random access memories.

Each of the processors are identical in the presently preferred embodiment, however, each is loaded with unique microcode upon initialization, and thus performs a different function. The processor 39 is referred to as the "state unit". The memory 43 stores the state array discussed above, and also the fanout table. The processor 40 is referred to as the evaluation unit (EU) and its memory 45 stores the behavioral characteristics of the components in the system being simulated, such as the truth tables for the gates. The processor 41 or queue unit (QU) with its memory 46 stores the events which drive the algorithm and the delay times for the gtes and the like.

As will be described, each of the processors operates simultaneously with information being pipelined between them through buses 49, 50 and 51. In the current embodiment, the processors operate at a clock rate of 6.7 mHz from a common clock.

DESCRIPTION OF THE PROCESSORS USED IN THE INVENTED COMPUTER

Figure 2:
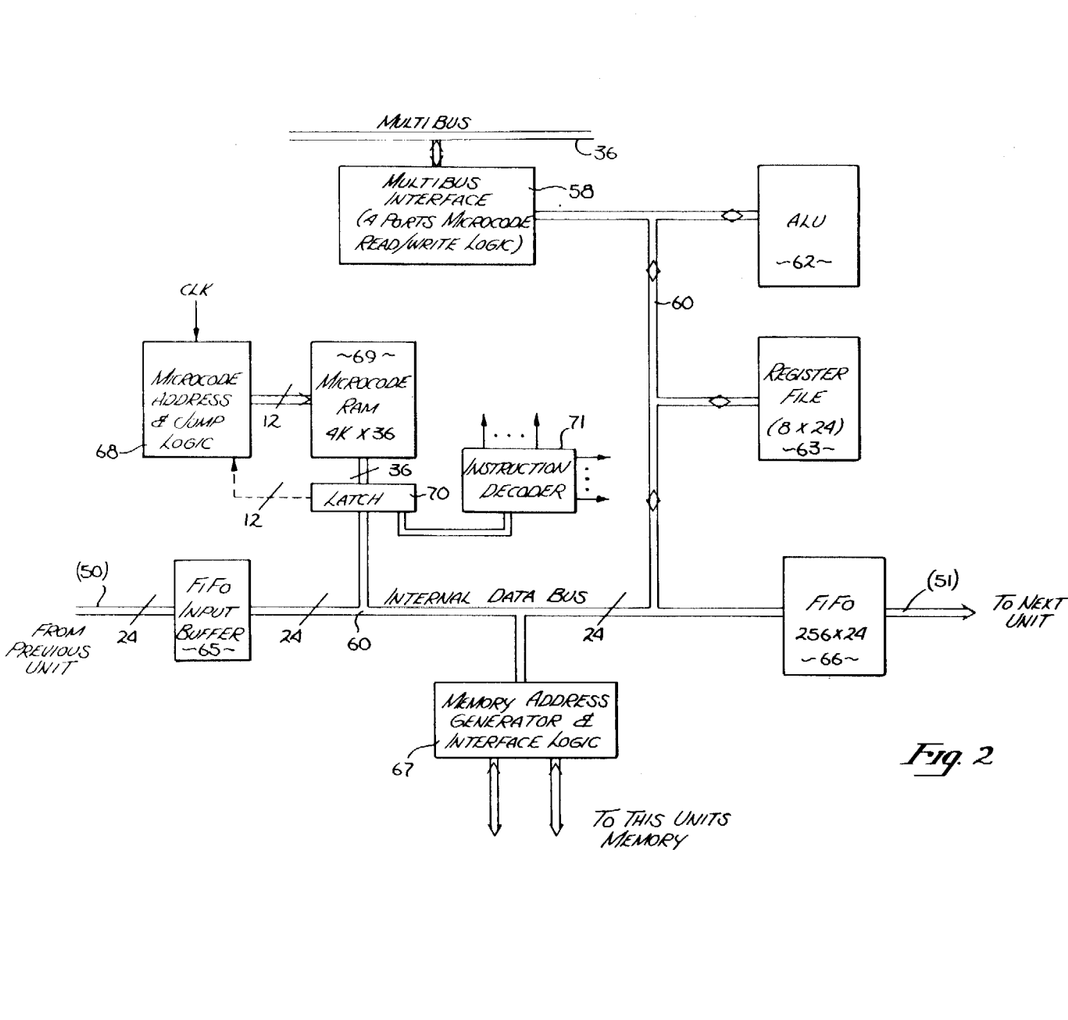
FIG. 2 is a block diagram illustrating one of the processors used as part of the invented computer.

As mentioned, the three processors currently used are identical. As shown in FIG. 2, each of the processors has an internal data bus 60. This bus communicates with a Multibus 36 through the Multibus interface unit 58. The internal bidirectional 24-bit data bus is coupled to a first-in, first-out input buffer 65. This buffer accepts data from one of the other processors. For instance, in the case of processor 40 of FIG. 1, buffer 65 is coupled to the bus 50. The processor includes a first-in, first-out buffer 66. This buffer couples the internal data bus 60 to the next unit in the ring, and by way of example, for processor 40, is coupled to bus 51. The buffer 66 includes "elastic" memory of 256×24 bits (shown in detail in FIGS. 7a, 7b and 7c). This memory allows temporary storage of data for transmission to the next processor to compensate for speed differences in the processors. As mentioned, the processors operate from a common clock, however, the amount of time required by a particular processor to complete an operation may not be the same as the time required for another processor to complete an associated operation.

The memory address generator and interface logic unit 67 couples the internal data bus 60 to the processor's memory. This unit is shown in detail in FIGS. 8a and 8b. The unit 67 permits the formation of a 24bit address based on an address on the bus 60 and microcode from the RAM 69 (through latch 70).

The arithmetic operations for the processor are performed by an arithmetic logic unit (ALU 62). This 24 bit unit is a standard, commercial TTL part (74S382) with associated controls, latches, etc. A register file 63 having an 8×24 bit capacity is also coupled to the bus 60. This is an ordinary file permitting reading and writing into different locations simultaneously employing standard parts (74LS670).

Each of the processors is controlled by its microcode. The microcode is stored in a RAM 69 having capacity of 4k×36 bits. It is loaded upon initialization from the master computer through the bus 36. The microcode address and jump logic 68 includes a 12 bit counter which forms an address to select microcode instructions from the RAM 69. This unit receives a clocking signal for incrementing the counter from the common clock source of 6.7mHz. The output of the RAM 69 is coupled into a latch 70 which communicates with the instruction decoder 71 and bus 60. (Special instructions pass between the processors into the latch 70 which can cause the counter to jump to a new address.)

The instruction decoder 71 is coupled to the various units in the processor such as the ALU, register file, buffers, memory address generator, etc. to control these units as is typically done with decoded microinstructions. The decoder 71 is shown in detail in FIGS. 6a and 6b.

GENERAL OPERATION OF THE INVENTED COMPUTER

Upon initialization, microcode is loaded into each of the RAMs 69 of FIG. 2 (different for each processor) and the memories of each processor are programmed. Referring briefly to FIG. 3, for circuit simulation, memory 43 stores the state array, that is, the state of the various nodes and also the fanout table. The evaluation memory unit 45 receives the characteristics of each of the components, for instance, for gates 77 and 78 and their truth tables. The queue unit memory 46 receives all events requiring scheduling and stores them by "time" including the initial events. This memory also stores the gate delays. The processors' memories receive data on the circuit to be simulated from the master computer.

Figure 5:
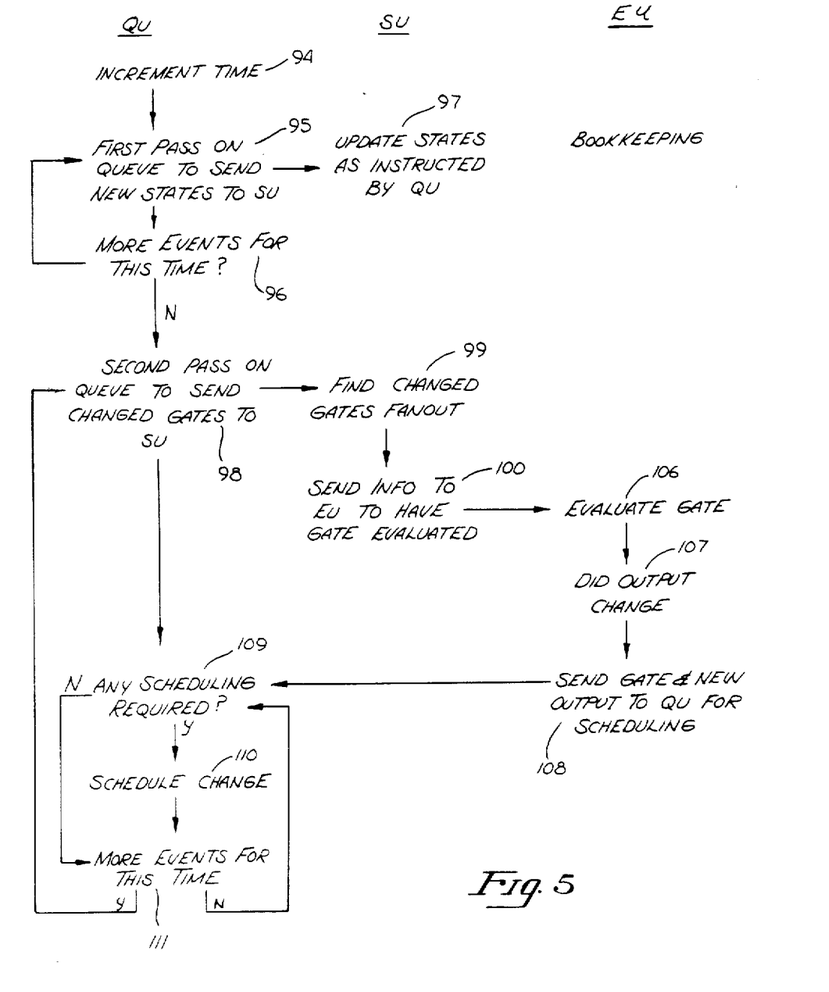
FIG. 5 is a flow diagram used to describe the event driven algorithm implemented by the invented computer.

The invented computer implements the algorithm shown in FIG. 5. The steps performed by the processor 41, the queue unit are shown under the heading QU in FIG. 5. Similarly, the steps performed by processor 39, the state unit, are shown under heading SU and those performed by processor 40, evaluation unit, shown under heading EU.

The predetermined units generally corresponding to time are incremented by the queue unit as shown by step 94. For each new time, the unit 94 determines if there are any events scheduled and if so, they are communicated (by node with its new state) to the state unit as indicated by step 95. This communication occurs over the bus 49 of FIG. 1. The state unit updates its memory as instructed by the queue unit as indicated by step 97. All the events scheduled for particular time are read from the queue unit's memory and sent to the state unit for updating the state array. The state array, as represented in memory 43 of FIG. 1, is updated simultaneously with the reading of events from the memory 46.

A second pass is made through the queue unit memory for each time interval as indicated by step 98. During step 98, the state unit again receives the nodes on which changes have occurred. During this second pass, the state unit prepares a list (based on the fanout list) of the gates coupled to those nodes. The state unit is thus able to send to the evaluation unit a list of gates whose inputs have changed, the change and the current output from the gate (steps 99 and 100).

The evaluation unit receives, for instance, the gate number, its new inputs, current output and determines if an output change has occurred as indicated by steps 106 and 107. If an output change has occurred, the new output is communicated for storage within the queue unit memory through bus 51 as indicated by step 108. The processor 41 from memory 46 can determine when this new output will occur (since it has stored the delays for each gate). Note that the evaluation unit has no sense of "time" but rather, simply evaluates the outputs of those gates where an input has changed.

Returning to step 98, after the queue unit sends the information concerning a changed gate to the state unit, it determines if any scheduling is required as indicated by step 109. (Note that because of the pipelining, the queue unit sends information on one gate to the state unit and may be receiving information on an entirely different gate when it next performs step 109.) After completing and scheduling (step 110) if there are more events for this time (step 111) there is a return to step 98. If there are no additional transmissions for the state unit for this time interval, there is a return to step 109 to receive the remaining data from the evaluation unit. When there is no additional scheduling required, and no events for the time under consideration, there is a return to step 94.

In practice, steps 94, 95, 96 and 97 occur quite quickly and only require approximately 10 to 20 percent of the computer's time. The majority of the time required for simulation occurs for the remaining steps.

MICROCODE DECODER

The microcode decoder (instruction decoder 71 of FIG. 2) decodes the microcode instructions from the RAM 69 of FIG. 2 and provides the general control of the processor, as previously mentioned. The microcode instructions from the latch 70 of FIG. 2 are coupled to lines 122 of FIG. 6a. The decoder also permits the microcode instructions to directly specify data for the internal data bus 60 of FIG. 2. This data bus is shown in the righthand portion of FIG. 6b. The incoming microcode instructions on line 122 are coupled directly to the buffers 116, 117 and 118 permitting the direct specifying of data for the bus.

In general, each of the microcode instructions includes a 4-bit OP code which designates the class of instruction and two fixed fields for all instructions designating the source and destination across the internal data bus. The 3 to 8 bit decoder 113 shown in the upper lefthand corner of FIG. 6 determines the OP code from the signals on lines 124 (which are a subset of the signals on line 122). The decoder 113 also receives a valid signal on pins 4 and 5 to indicate whether the microcode instruction is valid, otherwise it is not executed. (Pin 6 is always coupled to a positive potential.) The instruction class is selected by the OP code as shown in the upper portion of FIG. 6a, starting with line 25. Specifically, these classes of instruction are: memory write, conditional jump, memory read, call, ALU, etc. Lines 126 and 127 provide specific zero ALU signals, line 128 clears a parity error and line 129 clears the first-in, first-out buffers on initialization.

Figure 6A:
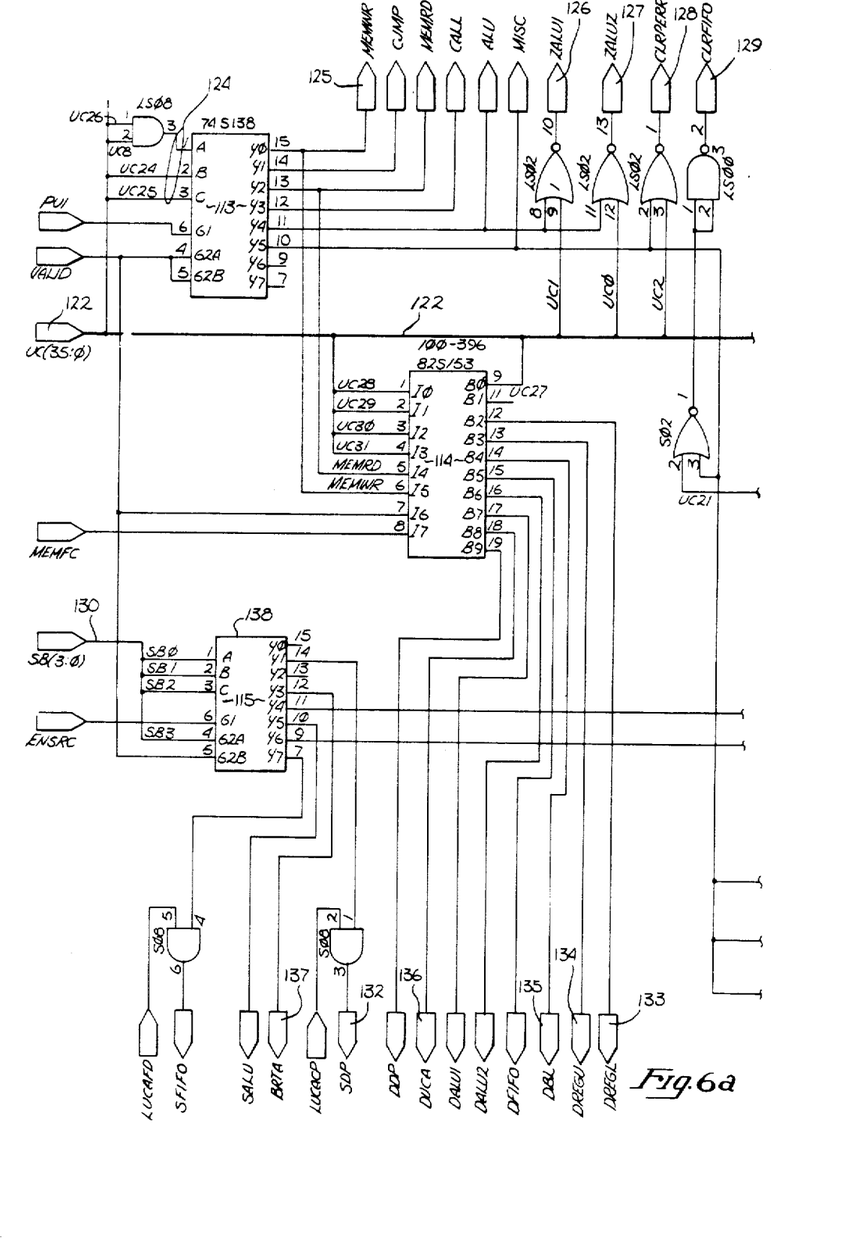
FIGS. 6a and 6b, together, is an electrical schematic of microcode decoder used in each of the processors.

The PLA 114 determines the destination for each microcode instruction; decoder 115 determines the source for the instructions. PLA 114 receives input signals from lines 122 in addition to the memory read and write signals (pins 5 and 6), the valid signal (pin 7) and a timing signal on pin 8. The decoder 115 receives the microcode instructions from a register file on lines 130, an enable source signal (pin 6) and the valid signal on pin 5.

The outputs from the PLA 114 and decoder 115 are shown in the lower portion of FIG. 6a. The "D" designation indicates the destination or that the data is to be "captured" while the "S" designation indicates source; that is, to "send out" data. For instance, "SDP" sends data from a data port (the Multibus) 36 of FIG. 2. Lines 133 and 134 are coupled to file registers, line 135 is for jump control logic for a bit latch, line 136 is coupled to the microcode address register and line 137 is used for jump logic.

Figure 6B:
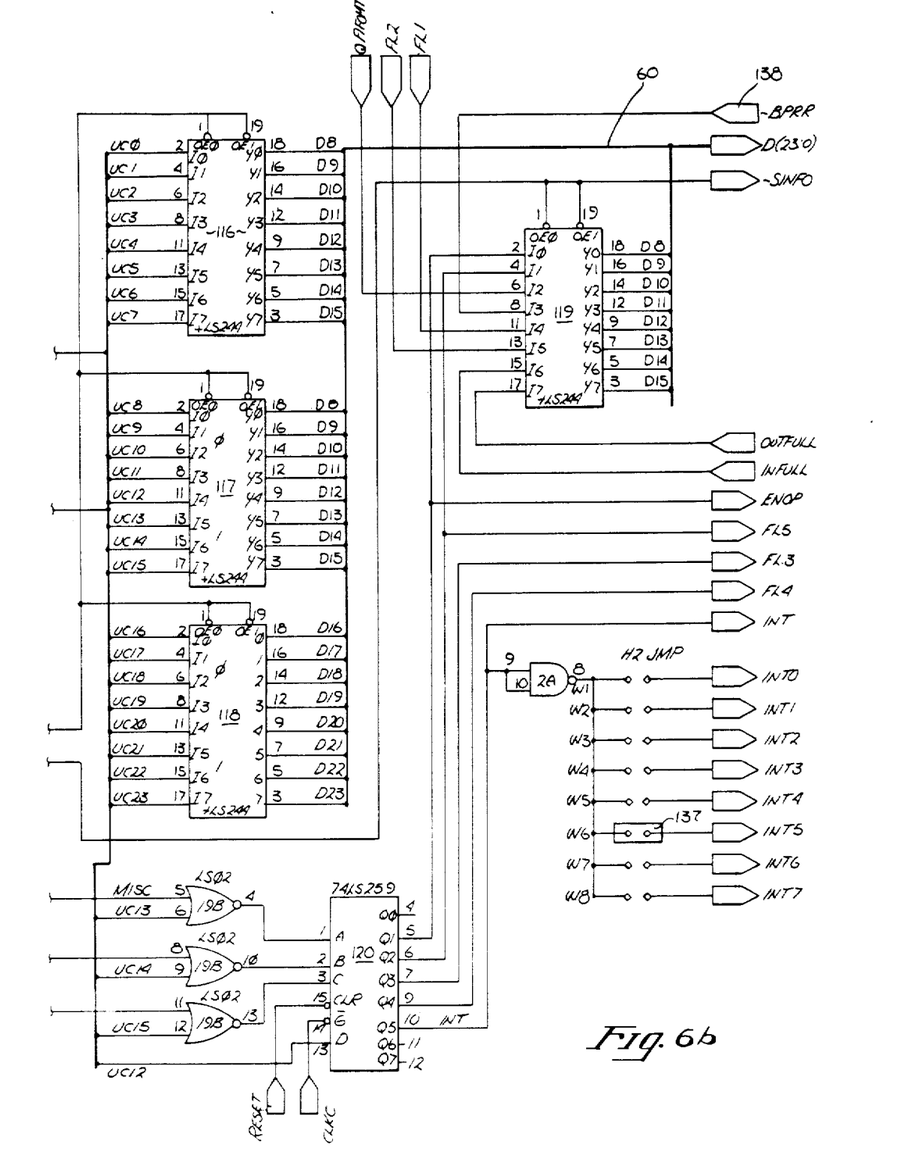

The latch 120 shown in the lower portion of FIG. 6b is a bit addressable latch which generates interrupts for the microprocessor used in the master computer. One of 8 interrupt lines are selected with a jumper as indicated by jumper 137. Other flag signals at the output of the latch 120 are used in conjunction with the 8086 processor of the master computer and are connected over the lines designated FL3, FL4, and FL5.

Buffer 119 is technically not part of the microcode logic. It contains various status bits which are coupled to the internal bus such as parity error on line 138, output and input buffer full signals and other status flags.

FIRST-IN, FIRST-OUT OUTPUT BUFFER

Referring briefly to FIG. 1, as mentioned, each of the processors provides data to one of the other processors in the ring. Each of the processors performs a different function, and hence, all the processors do not take the same amount of time to perform their functions. Some compensation is required to prevent a processor from having data to send to another processor before that other processor is ready to receive the data. Also, as mentioned, the output buffers of each of the processors such as buffer 66 of FIG. 2, is an "elastic" buffer (that is, it has an expandable memory). Each such buffer has the capacity to store up to 256, 24-bit words. The processor places data into the buffer at the rate at which the data is prepared. The data is removed from the buffer at a rate determined by the receiving processor.

Figure 7A:
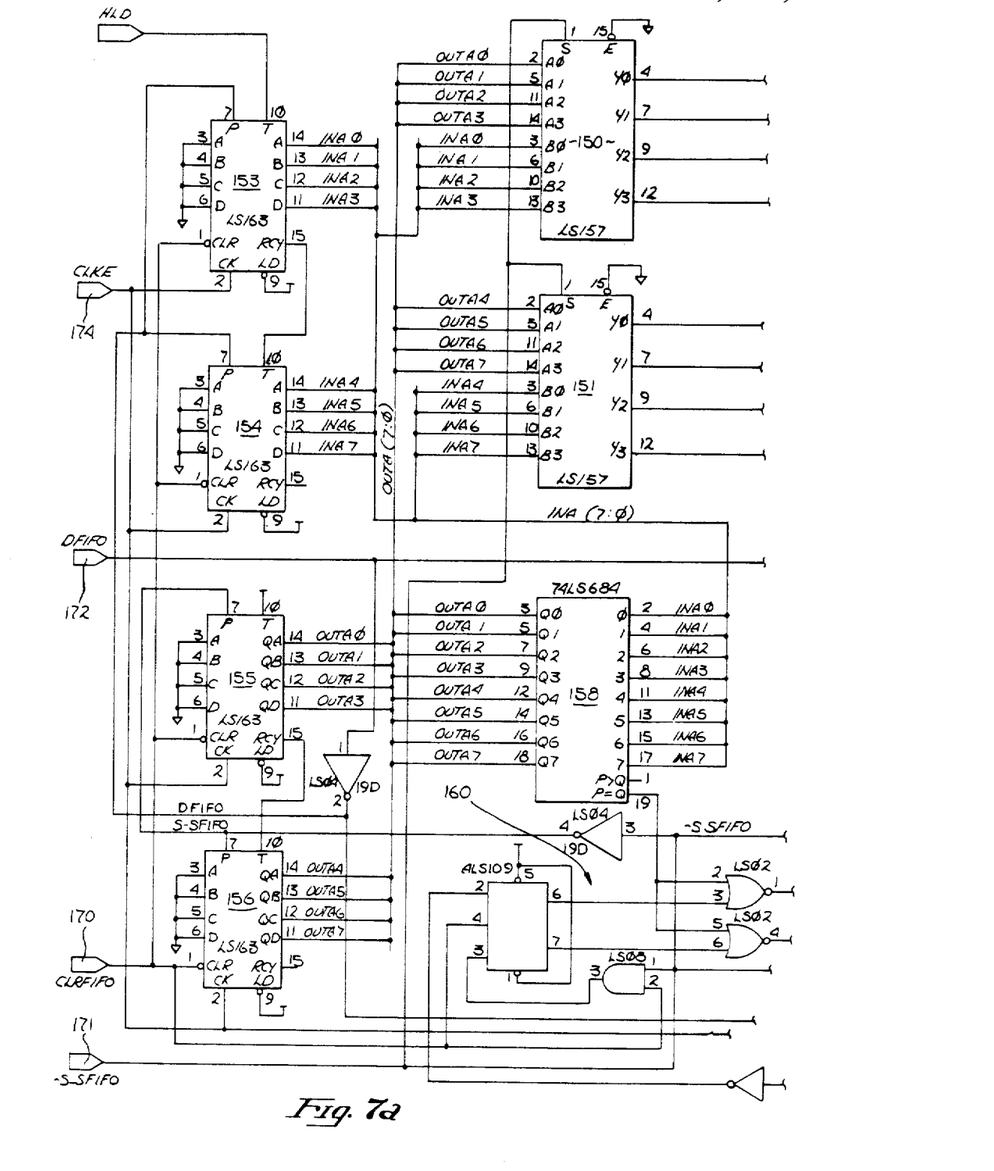
FIGS. 7a, 7b and 7c, together, is an electrical schematic of the first-in, first-out output buffer used in each of the processors.
Figure 7B:
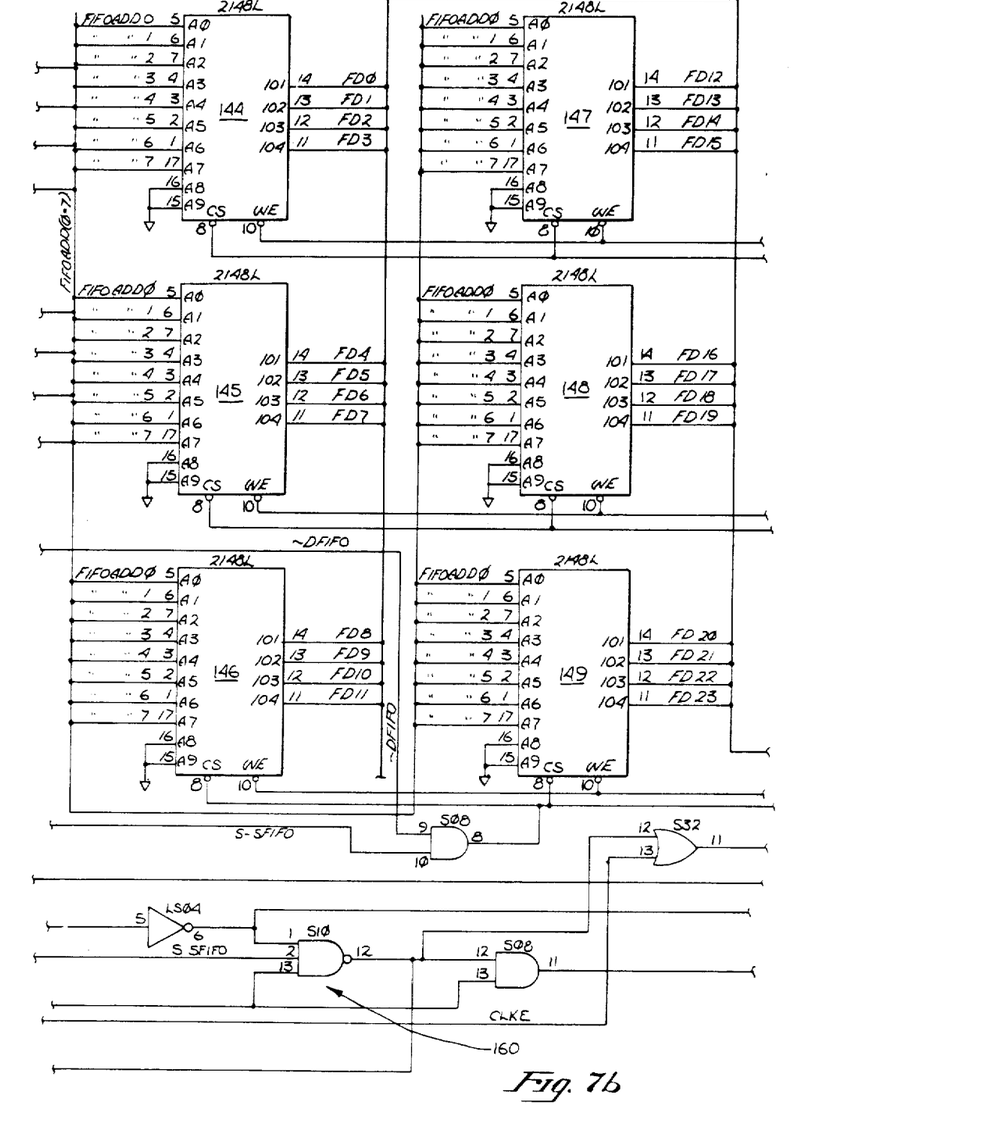
Figure 7C:
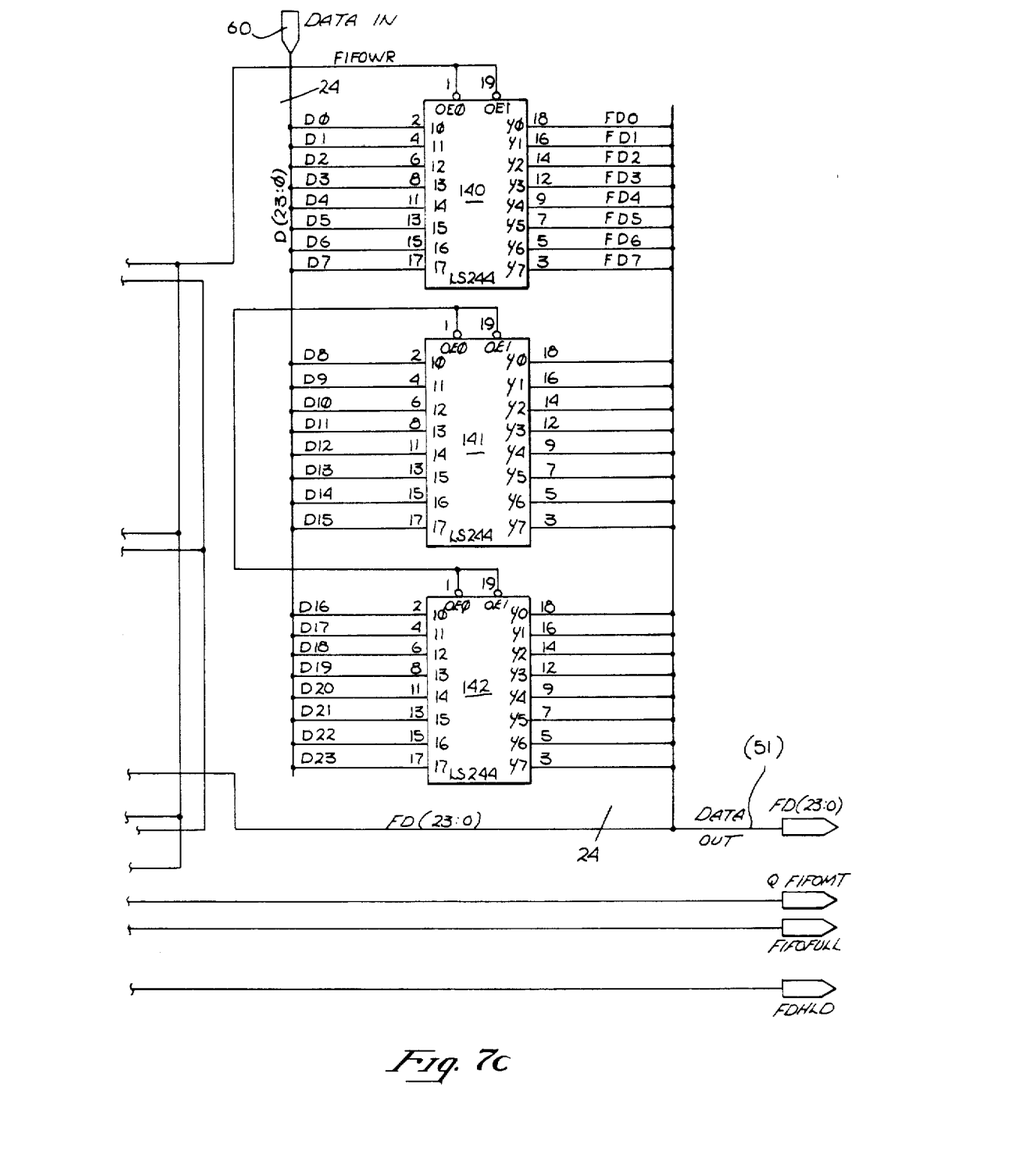

Referring to FIGS. 7a, 7b and 7c, data from the processor is coupled to the FIFO buffer through internal bus 60 shown in the upper part of FIG. 7c. The output data to the next processor is coupled via lines 51. Buffers 140, 141 and 142 of FIG. 7c buffer data coming into the FIFO buffer before it is stored and also buffers data from this storage for coupling onto lines 51.

The data in the FIFO buffer is stored in six random-access memory (RAM) "chips", specifically, RAMs 144, 145, 146, 147, 148 and 149 shown in FIG. 7b. Each of these static RAMs has a capacity of 4k bits, but as presently implemented, two of the address lines of each RAM are coupled to ground and thus the RAMs are used as 1k RAMs. Each RAM accesses for input data for each of the 8-bit addresses employed. Thus, for each 8-bit address, a 24-bit location is accessed.

Two RAM pointers are used to identify input data locations and output data locations. Counters 153 and 154 of FIG. 7a provide an address to the RAM while counters 155 and 156 provide an address for output data. The counters 153 and 154 are incremented each time a 24-bit word is placed within the memory, and similarly the counters 155 and 156 are incremented for each 24-bit word read from the memory. The counters are cleared on initialization with the signal on line 170, data flow to the next processor is controlled by a signal on line 171, the read-write commands for the RAMs are received on line 172 and a clocking signal for the counters is applied on line 174.

Data cannot simultaneously be written into and read from the RAMs 144-149. Thus, either the input address from output address from counters 153 and 154 or counters 155 and 156 may be coupled to the RAMs. Multiplexers 150 and 151 of FIG. 7a select either the input pointer or output pointer for coupling to the RAMs.

Comparator 158 compares the input pointer and the output pointer. More specifically, it compares the count at the outputs of the counters 153 and 154 with the count at the output of counters 155 and 156. If these addresses are equal, data is being directed into and read from the same locations in the RAMs. This means that the buffer is either full or empty. When this condition occurs, the logic circuit 160 shown in the bottom portion of FIGS. 7a and 7b determines whether the buffer is full or empty and generates signals which indicate the buffer is either full or empty (see lower righthand corner of FIG. 7c). If the buffer is empty, data is prevented from being read from the buffer, although the data may be written into the buffer. Conversely, if the buffer is full, data is prevented from being written into the buffer, although data may be read from the buffer.

MEMORY ADDRESS GENERATOR

Each of the processors include a memory address generator and interface logic unit such as unit 67 of FIG. 2. As previously mentioned, addresses can be generated for each of the processor's memory with a combination of signals from microcode and the data bus. This is a particularly important feature since, as will be described, it accelerates address generation. A relatively large number of memory accesses are required for implementing the algorithm, therefore saving time in generating the addresses is important.

Each of the processors' memories is divided into sections. The microcode selects a section (base address) while signals from the data bus are used as an offset within this section. By way of example, if the section of memory begins with address 1000, and the particular location of interest within this section is at 3, the processor must add 1000 and 3 to produce the address of 1003 before accessing the memory. As will be seen, this addition operation is, in effect, performed by selecting "1000" from the microcode lines and "3" from the data lines to provide the needed address without requiring actual addition.

Figure 8A:
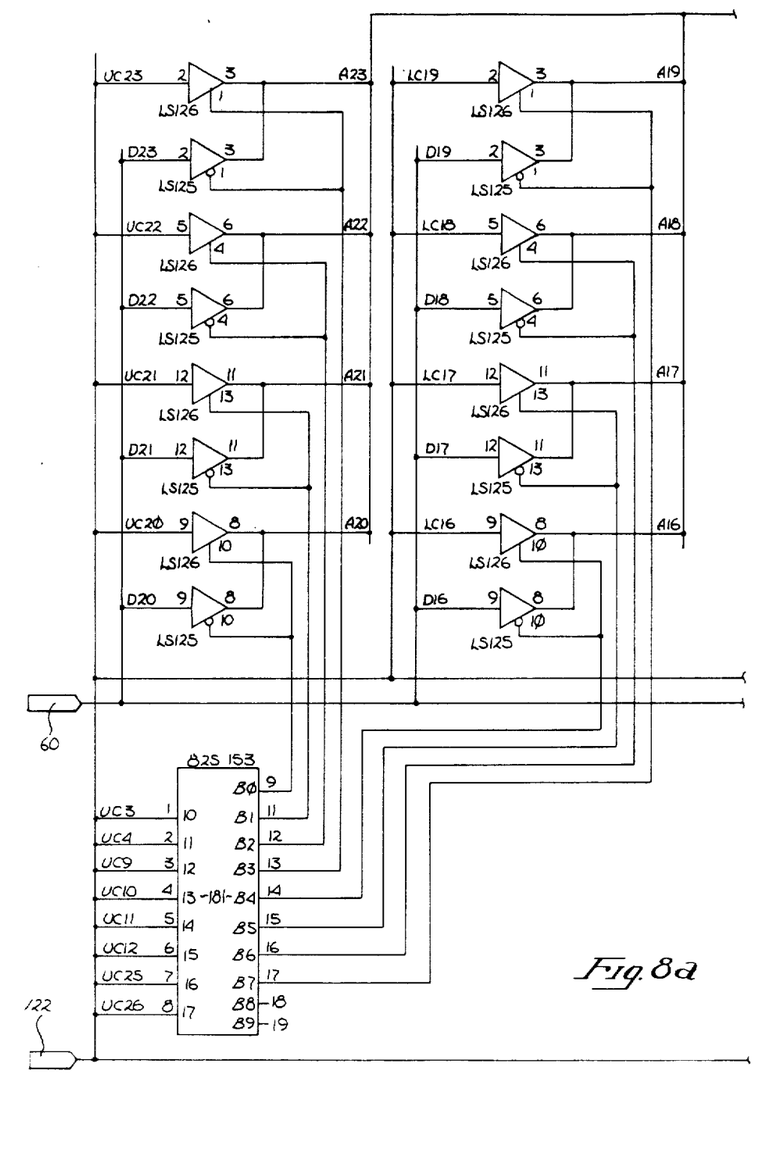
FIGS. 8a and 8b, together, is an electrical schematic of the memory address generator used in each of the processors.
Figure 8B:
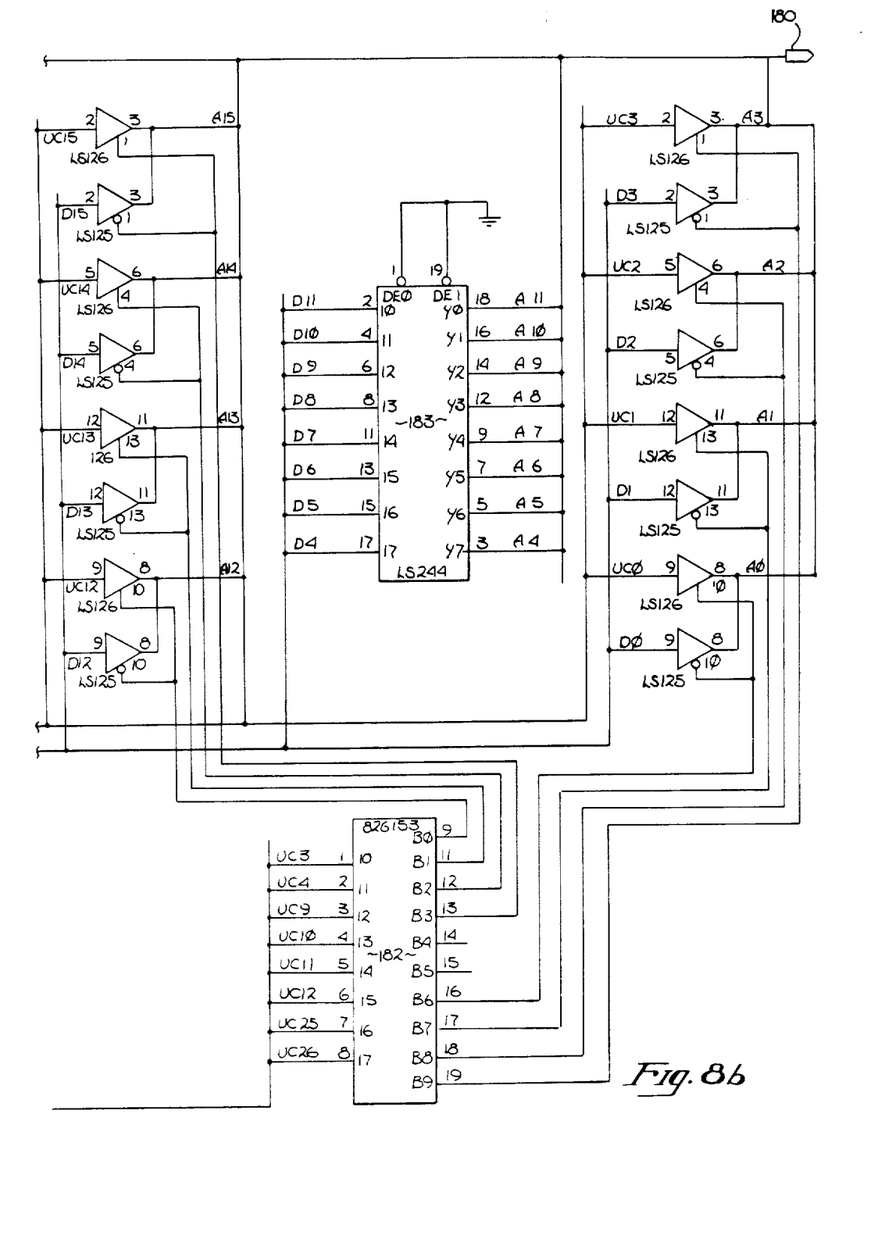

Referring to FIGS. 8a and 8b, the address generator is coupled to the data bus 60, and receives the microcode instructions from the microcode RAM on lines 122. The memory address (A0 to A23) is provided on lines 180 and is coupled to the memory for accessing the memory in an ordinary manner.

There are three columns of gates, two in FIG. 8a, and the third on the lefthand side of FIG. 8b used for the base section of the memory address. The input terminals of these gates are alternately coupled to the data bus 60 and lines 122 from the microcode RAM. Eight lines from the microcode RAM are also coupled to PLAs 181 and 182. The output from these arrays are coupled as control signals to the three columns of gates. The output of the gates provide the address signals $A_{12}$ through $A_{23}$. The arrays 181, 182, in response to microcode instructions, can select either a line from the data bus or microcode RAM for the addresses $A_{12}$ through $A_{23}$.

Eight lines from the data bus 60 (D4–D11) are coupled directly to a buffer 183. The output of this buffer provides the address signals A4–A11 which is, in general, the offset described above.

Efficient implementation of the algorithm requires structures in memory, that is, grouping of related data at adjacent locations. For instance, for each event, a gate number, time, new gate output and link are stored. The base address and offset are used to identify the structure; four address bits are used to identify elements within the structure. The address bits $A_O$ through $A_3$ developed from the column of gates shown on the righthand portion of FIG. 8b select the elements within the structure. These address bits are microcode controlled from PLA 182 and are selectable from either the microcode or the data bus. Data lines D0, D1, D2, and D3 and microcode lines UCO, UC1, UC2 and UC3 are coupled to these gates.

The selection of the address bits as described above places some constraints on the partitioning of the memory into sections and the sections into structures. By way of example, a memory section can not begin at address 1001. An offset can not be "added" to this base address since true addition is not be performed by the selection process used by the address generator. A memory section can, however, begin at address 1000 and have 249, 4 element structures, by way of example. This is not a significant constraint when compared to the advantage obtained.

Thus, a slave computer has been described which implements an event driven algorithm. The processing performed by the slave computer is partitioned in a unique manner and performed by three processors to provide highly efficient implementation of the algorithm.

I claim:

1. A computer system for implementing an event driven algorithm comprising:
   a master computer for providing overall control of said computer system and for providing user interface;
   a slave computer for implementing said algorithm under control of said master computer, said slave computer including a plurality of processors each for performing predetermined steps of said algorithm;
   interface means for providing an interface between said master and slave computer;
   a first bus coupling said master computer said interface means;
   a second bus coupling said interface means to each of said plurality of processors;
   each of said plurality of processors being microprogrammable and each having a respective memory;
   said plurality of processors being interconnected by a plurality of isolated buses disposed in an arrangement wherein each of said plurality of processors is coupled to a respective next adjacent processor of said plurality of processors for coupling data from each of said plurality of processors to a respective next adjacent processor of said plurality of processors;
   each of said plurality of processors receiving an input representing an event from said respective memory of said processor and performing at least one of said predetermined steps of said algorithm for said given event and pipelining results of said given events as input to said respective next processor of said plurality of processors;
   whereby said event driven algorithm is executed by pipelining results of said plurality of processors and said plurality of processors operating in parallel.

2. The computer system defined by claim 1 wherein said first and second buses are bidirectional multibuses.

3. The computer system defined by claim 2 wherein said plurality of isolated buses are unidirectional buses.

4. The computer system defined by claim 3 wherein each of said processors includes a data bus and a memory address generator which is coupled between said data bus and said respective processor memory, and wherein said generator provides addresses for said memory which are a combination of signals from said data bus and microcode storage means.

5. The computer system defined by claim 4 wherein said plurality of processors are interconnected by said plurality of isolated buses disposed in a ring arrangement.

6. The computer system defined by claim 1 wherein said plurality of processors are interconnected by said plurality of isolated buses disposed in a ring arrangement.

7. A computer for implementing an event driven algorithm which simulates a system having a plurality of elements comprising:
   a first, second and third processor, said second processor coupled to receive signals from said first processor, said second processor being a respective adjacent processor of said first processor, said third processor coupled to receive signals from said second processor, said third processor being a respective adjacent processor of said second processor, and said first processor coupled to receive signals from said third processor, said first processor being a respective adjacent processor of said third processor;
   said first processor having a first memory for storing the state of said elements in said system at a plurality of predetermined intervals of time;
   said second processor having a second memory for storing the behavior characteristics of said elements in said system to said events;
   said third processor having a third memory for storing information representative of changes to said elements in said system at the ones of said intervals at which said changes will occur;
   said first, second and third processors being coupled to operate on the contents of their respective memories in response to signals received from said third, first and second processors, respectively;
   said signals pipelining results of a given event as input to one of said respective adjacent processors of said first, second, and third processors that is operating next;
   a control computer coupled to an interface means that is coupled to said first, second, and third processors, wherein said control computer is for controlling the operation of said processors;
   whereby said processors execute on their stored information substantially simultaneously to pipeline results of said given event of said event driven algorithm.

8. The computer defined in claim 7 wherein each of said processors also include:
   a data bus;
   a first-in, first-out input buffer coupled to said data bus;
   a first-in, first-out output buffer coupled to said data bus;
   said input buffer for receiving data from a previously adjacent processor;
   said output buffer for transmitting data to a next adjacent processor;
   an arithmetic logic unit coupled to said data bus;
   a microcode storage means for storing microcode instructions, coupled to said data bus,
   decoder means for decoding instructions from said microcode storage means coupled to said microcode storage means and said arithmetic logic unit; and,
   address generation means coupled between said data bus and said memory for generating memory addresses.

9. The computer defined by claim 8 wherein said address generation means is coupled to said microcode storage means and operates under the control of said storage means to produce said memory addresses which are combinations of signals from said data bus and signals from said microcode storage means.

10. The computer defined by claim 9 wherein said control computer includes means for providing an interface with a user.

11. The computer defined by claim 7 wherein said third memory also stores certain behavior characteristics of said elements.

* * * * *